US011143056B2

United States Patent
Escobedo Hernandez et al.

(10) Patent No.: US 11,143,056 B2
(45) Date of Patent: Oct. 12, 2021

(54) SYSTEM AND METHOD FOR GAS TURBINE COMPRESSOR CLEANING

(71) Applicant: General Electric Company, Schenectady, NY (US)

(72) Inventors: Ernesto Heliodoro Escobedo Hernandez, Queretaro (MX); Monica Lizbeth Perez, Queretaro (MX)

(73) Assignee: General Electric Company, Schenectady, NY (US)

( * ) Notice: Subject to any disclaimer, the term of this patent is extended or adjusted under 35 U.S.C. 154(b) by 276 days.

(21) Appl. No.: 15/239,435

(22) Filed: Aug. 17, 2016

(65) Prior Publication Data

US 2018/0051588 A1 Feb. 22, 2018

(51) Int. Cl.
*F01D 25/00* (2006.01)
*G06F 30/20* (2020.01)

(52) U.S. Cl.
CPC ........... *F01D 25/002* (2013.01); *G06F 30/20* (2020.01); *F05D 2270/11* (2013.01); *F05D 2270/71* (2013.01)

(58) Field of Classification Search
CPC .... F01D 25/002; G06F 17/5009; G06F 30/20; G06F 30/25; G06F 30/27; G06F 30/28; G06F 2111/00; G06F 2119/22; F05D 2270/11; F05D 2270/71
See application file for complete search history.

(56) References Cited

U.S. PATENT DOCUMENTS

| 4,766,553 A | 8/1988 | Kaya et al. |
| 4,949,276 A | 8/1990 | Staroselsky et al. |
| 8,273,184 B2 * | 9/2012 | Wagner ..................... B08B 3/00 134/113 |

(Continued)

FOREIGN PATENT DOCUMENTS

| JP | 2011515620 A | 5/2011 |
| JP | 2012113708 A | 6/2012 |

(Continued)

OTHER PUBLICATIONS

Aretakis, N. et al., "Compressor washing economic analysis and optimization for power generation," Applied Energy 95 pp. 77-86 (2012) (Year: 2012).*

(Continued)

*Primary Examiner* — Rehana Perveen
*Assistant Examiner* — Steven W Crabb
(74) *Attorney, Agent, or Firm* — Fletcher Yoder P.C.

(57) ABSTRACT

In one embodiment, a method includes sensing first operations for one or more turbine systems in a fleet of turbine systems via a plurality of sensors disposed in the one or more turbine systems before a first wash operation. The method further includes sensing second operations for the one or more turbine systems via the one or more sensors after the water wash operation. The method also includes deriving at least one forecasting model based on the sensing first operations and the sensing second operations, wherein the at least one forecasting model is configured to predict a performance of a turbine system of the one or more turbine (Continued)

systems. The method additionally includes applying the at least one forecasting model to derive a predictive improvement in the performance for the turbine system.

20 Claims, 4 Drawing Sheets

(56) References Cited

U.S. PATENT DOCUMENTS

| | | | |
|---|---|---|---|
| 2004/0024559 A1* | 2/2004 | Down | G01D 18/008 702/127 |
| 2005/0096832 A1* | 5/2005 | Takada | B08B 3/02 701/100 |
| 2007/0073525 A1* | 3/2007 | Healy | G05B 13/04 703/7 |
| 2007/0089440 A1 | 4/2007 | Singh et al. | |
| 2008/0027616 A1* | 1/2008 | Zhang | F04D 27/02 701/99 |
| 2008/0178600 A1* | 7/2008 | Healy | F02C 9/00 60/773 |
| 2011/0264408 A1* | 10/2011 | Welch | G06Q 30/02 702/182 |
| 2013/0024179 A1* | 1/2013 | Mazzaro | G06Q 10/04 703/18 |
| 2013/0170952 A1 | 7/2013 | Brenne et al. | |

FOREIGN PATENT DOCUMENTS

| | | |
|---|---|---|
| JP | 2016142266 A | 8/2016 |
| WO | 2013127996 A1 | 9/2013 |

OTHER PUBLICATIONS

Hovland, G. et al., "Economic Optimisation of Gas Turbine Compressor Washing," Australasian Universities Power Engineering Conference (AUPEC 2004), pp. 1-6, Sep. 26-29, 2004 (Year: 2004).*
Notice of Reasons for Refusal, Office Action for Japanese Patent Application No. 2017-153772, in Japanese Language with English Language (Machine Translation), dated Apr. 8, 2021, 8 pages.

* cited by examiner

SYSTEM AND METHOD FOR GAS TURBINE COMPRESSOR CLEANING

BACKGROUND OF THE INVENTION

The subject matter disclosed herein relates to gas turbine compressors, and more specifically, to systems and methods for cleaning of gas turbine compressors.

Gas turbine systems typically include a compressor for compressing a working fluid, such as air. The compressed air is injected into a combustor which heats the fluid causing it to expand, and the expanded fluid is forced through a turbine. As the compressor consumes large quantities of air, small quantities of dust, aerosols and water pass through and deposit on the compressor (e.g., deposit onto blades of the compressor). These deposits may impede airflow through the compressor and degrade overall performance of the gas turbine system over time. Therefore, gas turbine engines may be periodically washed to clean and remove contaminants from the compressor; such operations are referred to as an offline wash operation or an online wash operation. The offline wash operation is performed while the gas turbine engine is shutdown. Contrarily, the on-line water wash operation allows the compressor wash to be performed while the engine is in operation, but degrades performance of the gas turbine system somewhat. There is a desire, therefore, for a water wash system that provides for more effective cleaning of turbine compressors, and improves water wash methods and systems.

BRIEF DESCRIPTION OF THE INVENTION

In one embodiment, a method includes sensing first operations for one or more turbine systems in a fleet of turbine systems via a plurality of sensors disposed in the one or more turbine systems before a first wash operation. The method further includes sensing second operations for the one or more turbine systems via the one or more sensors after the water wash operation. The method also includes deriving at least one forecasting model based on the sensing first operations and the sensing second operations, wherein the at least one forecasting model is configured to predict a performance of a turbine system of the one or more turbine systems. The method additionally includes applying the at least one forecasting model to derive a predictive improvement in the performance for the turbine system.

In a second embodiment, a system includes a memory configured to store instructions and a processor. The processor is configured to sense first operations for one or more turbine systems in a fleet of turbine systems via a plurality of sensors disposed in the one or more turbine systems before a first wash operation. The processor is further configured to sense second operations for the one or more turbine systems via the one or more sensors after the water wash operation. The processor is additionally configured to derive at least one forecasting model based on the sensing first operations and the sensing second operations, wherein the at least one forecasting model is configured to predict a performance of a turbine system. The processor is also configured to apply the at least one forecasting model to derive a predictive improvement in the performance for the turbine system.

In a third embodiment, a tangible, non-transitory computer-readable media storing computer instructions thereon is provided. The computer instructions when executed by a processor, cause the processor to sense first operations for one or more turbine systems in a fleet of turbine systems via a plurality of sensors disposed in the one or more turbine systems before a first wash operation. The instructions further cause the processor to sense second operations for the one or more turbine systems via the one or more sensors after the water wash operation. The instructions also cause the processor to derive at least one forecasting model based on the sensing first operations and the sensing second operations, wherein the at least one forecasting model is configured to predict a performance of a turbine system. The instructions additionally cause the processor to apply the at least one forecasting model to derive a predictive improvement in the performance for the turbine system.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
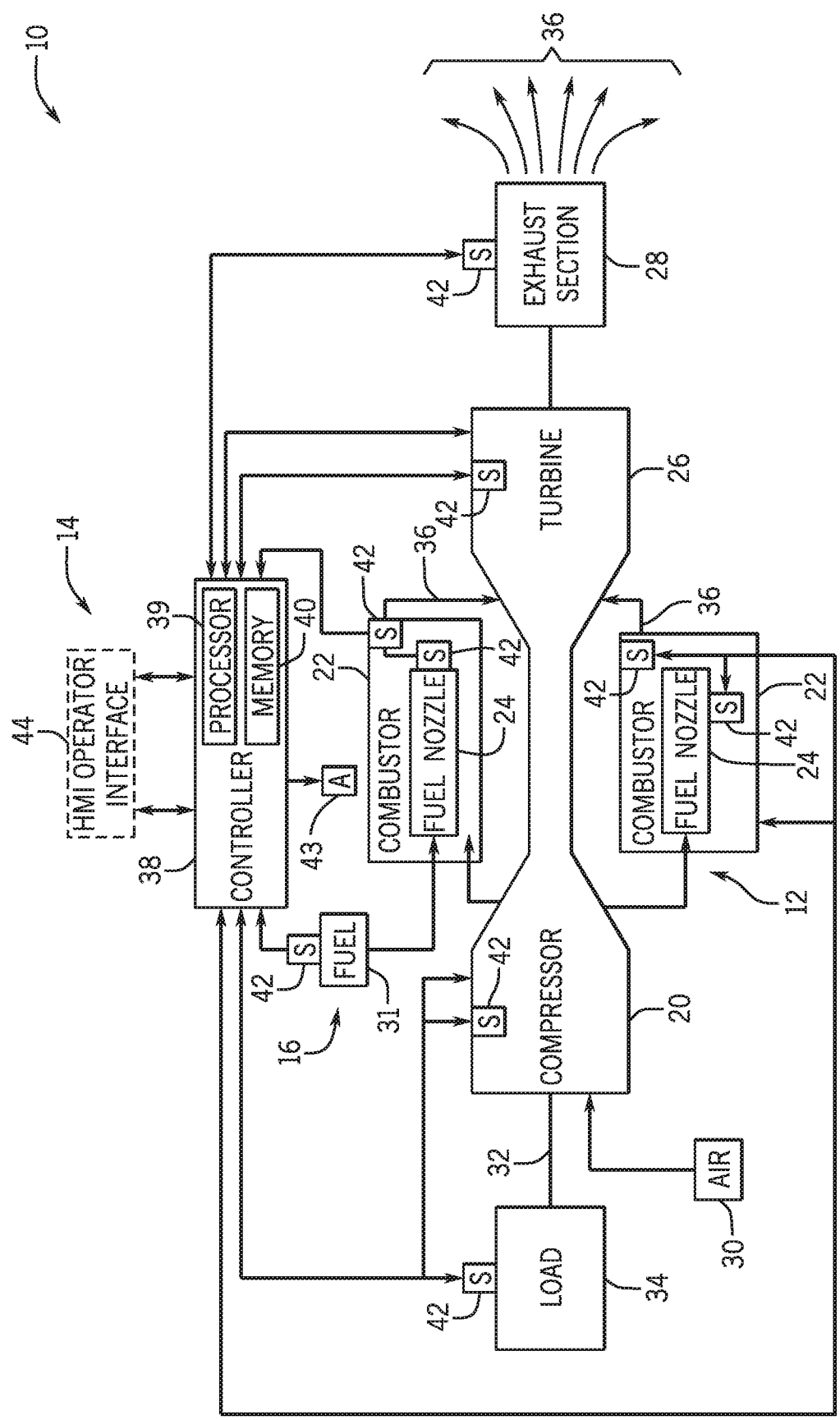
FIG. 1 is a schematic diagram of an embodiment of a power generation system.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

When turbine system users (e.g., power producing utilities) encounter low performance in turbine systems and the low performance is due to accumulated grime or, in general, dirtiness, one of the recommendations to improve performance is to perform a water wash on turbine engines. Such a water wash may recover the lost performance. However in some cases the grime is bonded to, for example, turbine engine compressor parts in such a way that water wash may no longer be an effective alternative to recover the lost efficiency. In these cases a hand cleaning is recommended. A hand cleaning operation typically involves shutting down the turbine system, letting the turbine engine cool down to a desired temperature, and manually scrubbing or otherwise hand scrubbing component such as inlet guide vanes, compressor blades, casings, and so on.

Before the techniques describe herein, the effectiveness of hand cleaning and/or other water wash operations may not have been predicted before performing the operation. The techniques describe herein enable a prediction or a forecast, for example, based on historical data from other water wash events, detailing how the hand cleaning process (or other water wash) would behave in a particular engine given the amount of degradation in that particular engine. The models derived also include risk adders that may be used to give estimates, such as estimates on power recovered. Once an estimate is derived, the utility or other user of the turbine system may better predict the impact of the water wash (e.g., hand cleaning) event.

The techniques described herein provide for a modeling methodology and for a forecast methodology suitable for improving water wash operations, and in an exemplary embodiment, hand cleaning operations, for the turbine system. In one embodiment, water wash (e.g., hand cleaning) model(s) are derived. The model(s) capture behavior and impact of hand cleaning under different conditions of degradation for the turbine system. Because certain water wash operations such as hand cleaning may not be exactly replicable procedures, dispersion (e.g., statistical dispersion) in results may be expected. Accordingly, the models derived herein may take the dispersion into account for risk modeling. In one embodiment, a process for modeling may be summarized as follows. First, perform a data collection from turbine engines where before and after the water wash. The data before water wash (e.g., before hand cleaning), may be used to establish a baseline on performance with respect to a new engine using various models, such as physics-based models. Such various models may be referred to as a cycle deck.

The performance baseline is aimed at obtaining certain performance parameters that describe the state of the turbine engines before any washing or hand cleaning is performed. Parameters may include speeds, velocities, fluid flows, temperatures, pressures, clearances (e.g., distances between moving and stationary components), fuel types, and so on. Embodiments of the models may include deriving flow functions, polytropic/isentropic efficiencies, leak fractions, multipliers and adders, based on the parameters.

Once the baseline is obtained, the data collected after the wash (e.g., hand cleaning procedure) may be analyzed in a consistent and comparable manner to the analysis for the baseline and the improvement is stored. The before/after analysis process may be performed on several turbine engines and, in one embodiment, a model function is derived from this data by optimizing (e.g., minimizing) a penalty function between the baseline and the improvement. In certain embodiments, the penalty function may be (but is not limited to) a sum of squared residuals, a sum of squared weighted residuals, and/or a log likelihood. The models also include techniques that consider dispersion in results which may or may not fit the model function exactly, so a probability model is derived as well, with the ability of predicting a risk level for forecasts that may be derived by the model function.

Once the models have been created, the models may be used for forecasting levels of improvement (e.g., extra power that may be generated) that may be achieved after washing (e.g., hand cleaning). During forecasting analysis, data may be collected from the actual turbine system where the hand cleaning procedure will be performed. Then, under a user-adjustable risk level, the models may derive an estimate (e.g., power level in megawatts estimate) for the impact of the hand cleaning procedure. When a state after hand cleaning has been obtained, which may be obtained via the forecasting models, the state may be inputted into, for example, a physics-based model, which may include a derivative table or any embodiment that can translate the state to derive certain other performance parameters such as power production, heat rate, fuel consumption, and/or other performance parameters, or execute the cycle deck itself to derive further cycle deck parameters (e.g., parameters derived by using the cycle deck such as temperatures, speeds, velocities, flows, pressures, clearances, emissions, and so on).

Turning now to FIG. 1, the figure is a diagram illustrating an industrial system 10, such as a power plant, that includes a gas turbine system 12, a monitoring and control system 14, and a fuel supply system 16. The gas turbine engine or system 12 may include a compressor 20, combustion systems 22, fuel nozzles 24, a gas turbine 26, and an exhaust section 28. During operation, the gas turbine system 12 may pull an oxidant such as air 30 into the compressor 20, which may then compress the air 30 and move the air 30 to the combustion system 22 (e.g., which may include a number of combustors). The air 30 may encounter an inlet guide vane system 31 having vanes that may be positioned at a variety of angles to optimize intake of the air 30 and operations of the gas turbine system 12.

In the combustion system 22, the fuel nozzle 24 (or a number of fuel nozzles 24) may inject fuel that mixes with the compressed air 30 to create, for example, an air-fuel mixture. The air-fuel mixture may combust in the combustion system 22 to generate hot combustion gases, which flow downstream into the turbine 26 to drive one or more turbine stages. For example, the combustion gases may move through the turbine 26 to drive one or more stages of turbine blades, which may in turn drive rotation of a shaft 32. The shaft 32 may connect to a load 34, such as a generator that uses the torque of the shaft 32 to produce electricity. After passing through the turbine 26, the hot combustion gases may vent as exhaust gases 36 into the environment by way of the exhaust section 28. The exhaust gas 36 may include gases such as carbon dioxide ($CO_2$), carbon monoxide (CO), nitrogen oxides ($NO_x$), and so forth.

In certain embodiments, the system 10 may also include a controller 38. The controller 38 may be communicatively coupled to a number of sensors 42, a human machine interface (HMI) operator interface 44, and one or more actuators 43 suitable for controlling components of the system 10. The actuators 43 may include valves, switches, positioners, pumps, and the like, suitable for controlling the various components of the system 10. The controller 38 may receive data from the sensors 42, and may be used to control the compressor 20, the combustors 22, the turbine 26, the exhaust section 28, the load 34, and so forth.

In the current embodiments, data from the sensors 42 may be collected the before any washing, such as before hand cleaning. The data may then be used, as further described below, to create one or more forecasting models suitable for baselining the performance of the current state of the turbine system 12, including any degradation of the turbine system 12, and for forecasting the impact of washing operations, such as hand cleaning operations, on the turbine system 12. Further, the models may include risk estimate models that may provide for a more accurate representation of the estimated accuracy provided by forecasting models. The model creation and use may be performed in the controller 38 and/or external computing systems, such as a workstation computer, laptop, notebook, and/or client computing systems.

In certain embodiments, the HMI operator interface 44 may be executable by one or more computer systems of the system 10. A plant operator may interface with the industrial system 10 via the HMI operator interface 44. Accordingly, the HMI operator interface 44 may include various input and output devices (e.g., mouse, keyboard, monitor, touch screen, or other suitable input and/or output device) such that the plant operator may provide commands (e.g., control and/or operational commands) to the controller 38. Further, operational information from the controller 38 and/or the sensors 42 may be presented via the HMI operator interface 44. Similarly, the controller 38 may be responsible for controlling one or more final control elements coupled to the components (e.g., the compressor 20, the turbine 26, the combustors 22, the load 34, and so forth) of the industrial system 10 such as, for example, one or more actuators, valves, transducers, and so forth.

In certain embodiments, the sensors 42 may be any of various sensors useful in providing various operational data to the controller 38. For example, the sensors 42 may provide pressure and temperature of the compressor 20, speed and temperature of the turbine 26, vibration of the compressor 20 and the turbine 26, $CO_2$ levels in the exhaust gas 36, carbon content in the fuel 31, temperature of the fuel 31, temperature, pressure, clearance of the compressor 20 and the turbine 26 (e.g., distance between the compressor 20 and the turbine 26 and/or between other stationary and/or rotating components that may be included within the industrial system 10), flame temperature or intensity, vibration, combustion dynamics (e.g., fluctuations in pressure, flame intensity, and so forth), load data from load 34, output power from the turbine 26, and so forth.

The controller 38 may include a processor(s) 39 (e.g., a microprocessor(s)) that may execute software programs to perform the disclosed techniques. Moreover, the processor 39 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 38 may include a memory device 40 that may store information such as control software, look up tables, configuration data, etc. The memory device 40 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory device 40 may store a variety of information, which may be suitable for various purposes. For example, the memory device 40 may store machine-readable and/or processor-executable instructions (e.g., firmware or software) for the processor execution. In one embodiment, the instructions, when executed, cause the processor 39 to create one or more models for use in forecasting performance improvements that may be provided by washing (e.g., hand cleaning) certain components of the turbine system 12, such as the compressor 20 and/or IGV system 31. By deriving forecasting and/or risk models which may then be subsequently used in predicting impact of certain wash operations, such as hand cleaning, the techniques described herein provide for improved maintenance operations and more efficient resource use for the power production system 10.

Figure 2:
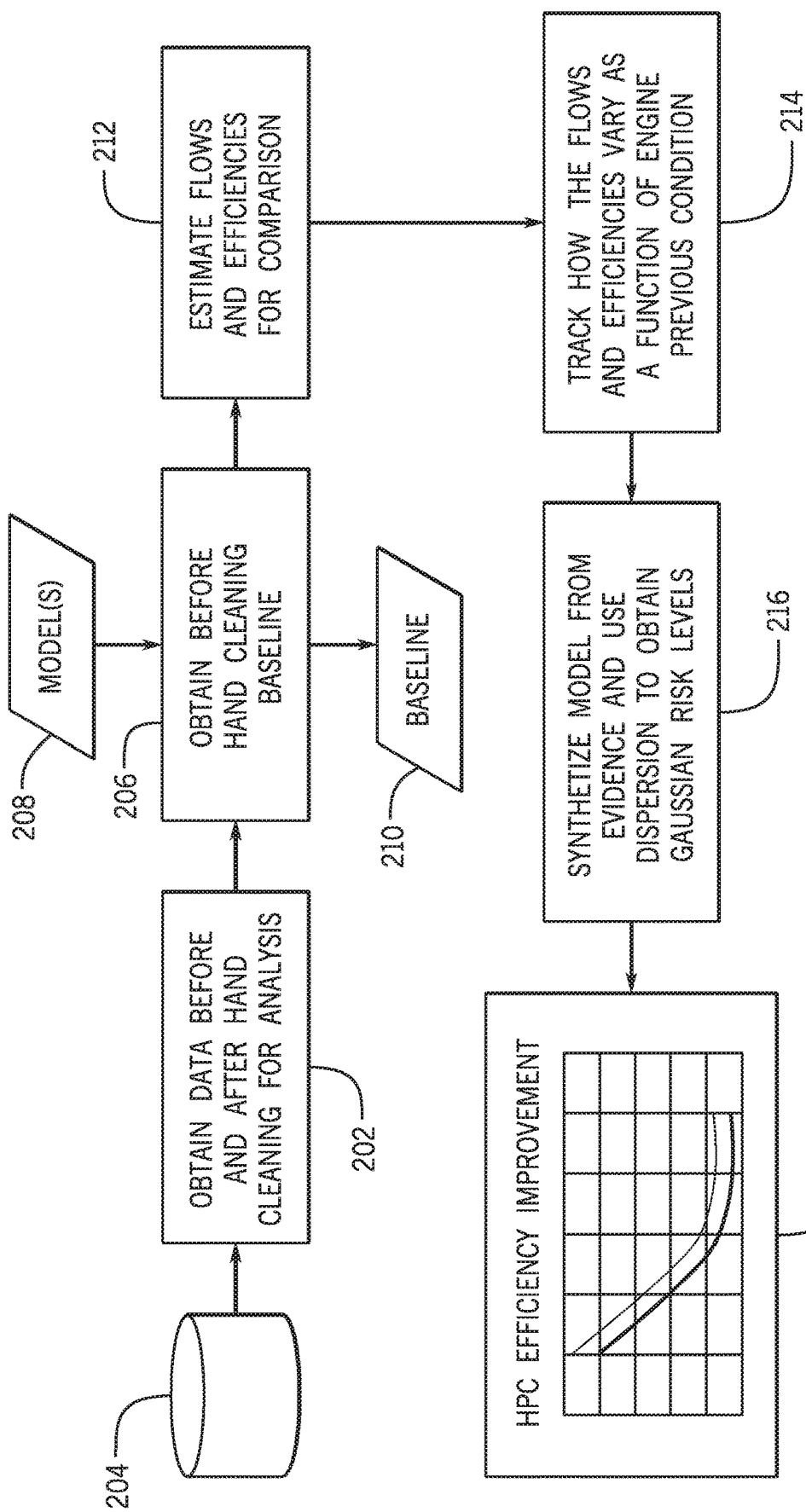
FIG. 2 is a flowchart of an embodiment of a process for deriving certain forecasting and/or risk models suitable for predicting a performance improvement for the system of FIG. 1 after a wash or hand cleaning.

FIG. 2 is a flowchart illustrating an embodiment of a process 200 suitable for creating or otherwise synthetizing models useful in predicting an impact (e.g., in improved megawatt production) of hand cleaning a specific installation of the turbine system 12 of FIG. 1 with a desired confidence level. The process 200 may be implemented as computer code or instructions executable by the processor(s) 39 and stored in the memories 40. In the depicted embodiment, the process 200 may obtain (block 202) data for both before and after hand cleaning for analysis. For example, logs 204 and/or sensor 42 data of operations for the power production system 10 may be queried to obtain power produced by the power production system 10, fuel type data, fuel flow data, other flow data (e.g., air flow), temperatures, pressures, clearances (e.g., distances between a stationary and a rotating component), speed, velocity, inlet guide vane (IGV) 31 position, IGV system 31 loss, exhaust system 28 loss, auxiliary loads, and so on. Data may also include maintenance data, such as type of maintenance that may have been performed before and/or after the hand cleaning, such as blade replacement/repair, and so on. Data collected may also include ambient conditions (e.g., temperature, humidity, atmospheric pressure). The data may be obtained (block 202) for a fleet of turbine systems 12. For example, the same or similar model numbers for the turbine system or engine 12 may be grouped together and data obtained for the group. In one non-limiting example, the turbine system 12 model may be a LM6000 gas turbine system available from General Electric Co. of Schenectady, N.Y. Accordingly, data for certain (or all) LM6000 gas turbines 12 may be collected (block 202).

As mentioned, data may first be collected (block 202) before a hand wash operation. A hand wash operation typically involves shutting down the turbine system 12, letting it cool down to a desired temperature, and manually scrubbing or otherwise hand scrubbing component such as inlet guide vanes, compressor blades, casings, and so on. While the techniques described herein are, in an exemplary embodiment, directed at analyzing and acting on hand cleaning data, other embodiments may analyze and act on other types of offline washes such as crank washing, and/or online washing. In crank washing, the turbine system 12 is shut down and allowed to cool. Then, water and/or detergent may be sprayed into the inlet guide vanes, compressor blades, and so on, while the turbine 12 is slowly rotated. In online washing, the turbine system 12 remains running while water is injected, for example, into the compressor 20 via an array of nozzles. Indeed, the techniques described herein may be used for hand washing, crank washing, online washing, or a combination thereof.

After the hand wash (and/or other wash type) is complete and the power production system 10 resumes operations, data may be collected again (block 202) to determine the impact of the hand cleaning (and/or other wash type), for example, in improving power production for the turbine system 12. The process 200 may obtain a before hand cleaning baseline performance (block 206) for the power production system 10 with the data collected before hand cleaning (and/or other wash type). The before hand cleaning performance baseline may be obtained (block 206) via one or more turbine system model(s) 208. That is, one or more models 208 may be used to determine how the turbine system 12 may perform given certain inputs or conditions (e.g., ambient conditions, fuel type, flows, pressures, speeds, velocities, auxiliary loads collected before the wash for the specific turbine system 12) and this determination may then be used to create a baseline 210. The baseline 210 may, for example, be representative of performance for the turbine system 12, including degradation. That is, conditions such as worn compressor 20 blades, worn turbine 26 blades, worn combustors 22, and so on, may be captured in the baseline 210. The models 208 may include physics-based models, such as the cycle deck. The models may also include physics-based models, such as such as thermodynamic models, low cycle fatigue (LCF) life prediction models, computational fluid dynamics (CFD) models, finite element analysis (FEA) models, solid models (e.g., parametric and non-parametric modeling), and/or 3-dimension to 2-dimension FEA mapping models that may be used to predict the risk of equipment malfunction or the need for equipment maintenance. Models may also include artificial intelligence (AI) models, such as expert systems (e.g. forward chained expert systems, backward chained expert systems), neural networks, fuzzy logic systems, state vector machines (SVMs), inductive reasoning systems, Bayesian inference systems, or a combination thereof.

The process 200 may then estimate (block 212) flows and efficiencies for comparison. More specifically, the process 200 may find differences between how a new turbine engine 12 would operate and how a fleet of turbine engines 12 would operate given the same conditions (e.g., ambient conditions, fuel type, load, and so on) before hand cleaning. These derived differences are then used to estimate or predict (block 212) certain flows, such as air flow, compressed fluid flows, combustion flows, exhaust flows, compressor 20 pressure ratios, as well as efficiencies such as compressor 20 and/or turbine 26 efficiencies (e.g., isentropic efficiencies), polytropic efficiencies, adiabatic efficiencies, compressor and/or turbine efficiency indices, flow capacity indices, and so on. The flows and efficiencies (block 212) may be estimated using a gas path analysis. For example, gas path analysis procedures as recommended by the Association of Mechanical Engineers (ASME) may be used to estimate (block 212) the flows and efficiencies for comparison. In one embodiment, the model(s) 208 (e.g., cycle deck) may be used in block 212. Parameters of the models(s) 208 may be changed so that the model outputs reflect the measured data. Using these changed parameters, the model(s) 208 may then output expected flows and efficiencies.

The process 200 may then track (block 214) the variation of the flows and efficiencies as a function of the previous conditions of various turbine system 12 after hand cleaning, such as a fleet of turbine systems 12. The flows and efficiencies are tracked (block 214) as a function of the turbine system's previous condition because turbine system performance and/or efficiency is related to dirtiness of the compressor 20. As you remove the dirtiness, you would typically gain performance and/or efficiency. Forecasting model and/or risk models 218 may then be created or synthetized (block 216) from evidence as to how the flow and efficiencies are related to hand cleaning impact. Dispersion in the forecasting model may then be used to derive (block 216) risk levels, such as Gaussian risk level models. In one embodiment, the models 218 include a model function that is derived from before/after data by optimizing (e.g., minimizing) a penalty function between the baseline 210 and derived improvements. In certain embodiments, the penalty function may be (but is not limited to) a sum of squared residuals, a sum of squared weighted residuals, and/or a log likelihood.

Depending on the number of samples and the like, other distributions may be used for the risk level models, such as but not limited to chi squared distributions, Weibull distributions, t-distributions, or any other distribution that may improve risk level determination. Derived forecasting and/or risk models 218 may then be used to forecast impact of a wash such as a hand cleaning, as well as risk levels for the wash procedure, as described in more detail below.

Figure 3:
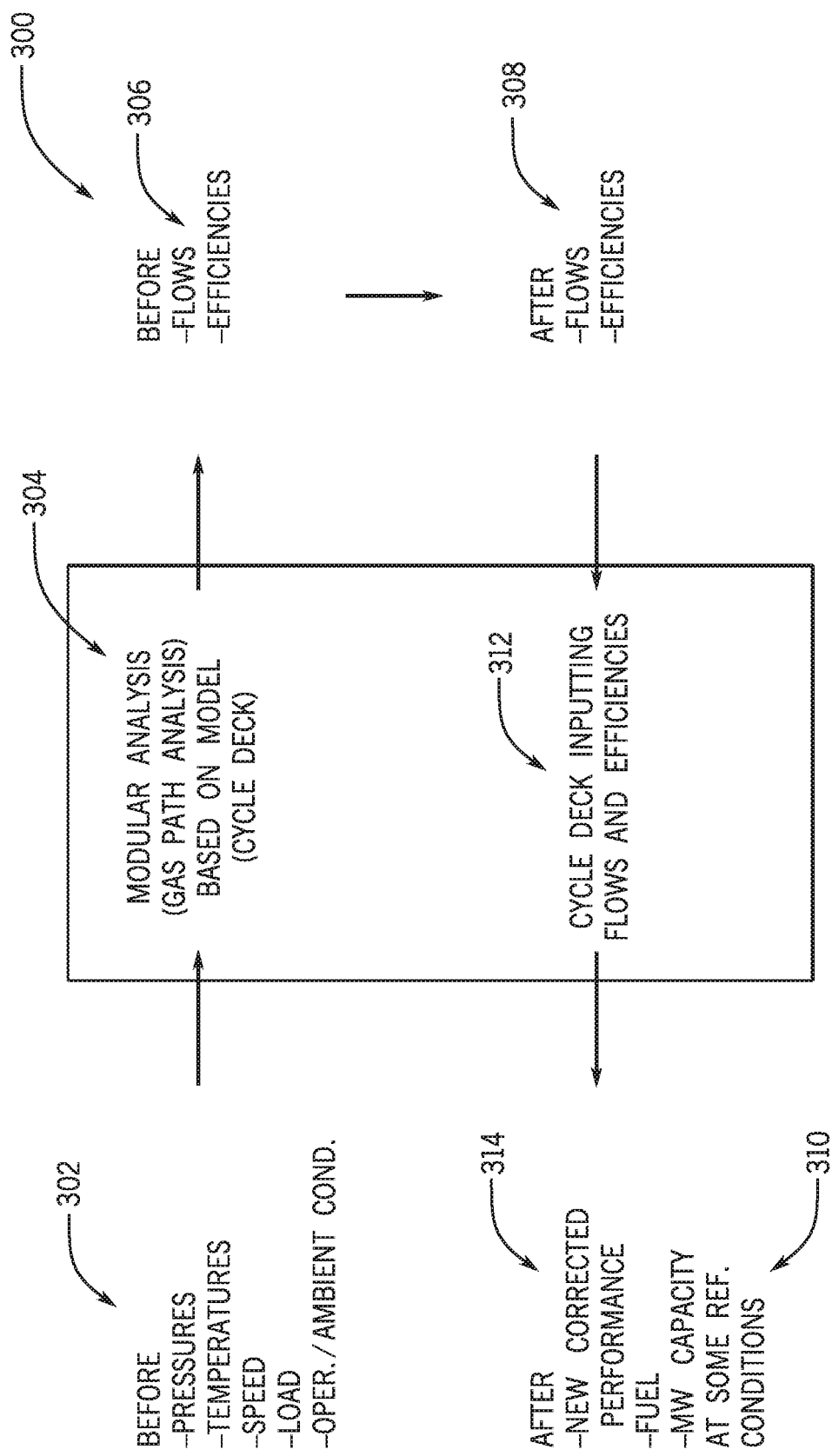
FIG. 3 is a an information flow diagram of an embodiment of details for the process of FIG. 2.

To further illustrate the process 200, FIG. 3 is an embodiment of an information flow diagram 300 suitable for using before and after data collected, for example by the block 202 and then subsequently analyzed by blocks 212, 214, and/or 216. In the depicted embodiment, data 302 may correspond to the data collected by the block 202 of the process 200 before hand cleaning. As mentioned earlier, the data 302 may include pressures, temperatures, speeds, loads, and/or ambient and other operating conditions. The data 302 may then be analyzed (block 304), for example, by using the model(s) 208, to derive flows and efficiencies 306. As mentioned previously, the flow and efficiencies may include isentropic efficiencies, polytropic efficiencies, adiabatic efficiencies, compressor and/or turbine efficiency indices, flow capacity indices, and so on, for modules of the turbine system 12 including the compressor 20 and the turbine 26. The flows and efficiencies 306 may be derived by applying, for example, gas path analysis via the model(s) 208.

Flows and efficiencies after hand cleaning 308 may be tracked or otherwise analyzed as the turbine systems 12 undergo hand washing. More specifically, as the various turbine systems 12 in the fleet are hand cleaned (or otherwise washed), flow and efficiencies 308 are derived again. Then, using some reference conditions 310, parameters in the model(s) 208 may be adjusted (block 312) to derive performance parameters 314. The performance parameters 314 may include a megawatt capacity after hand cleaning, fuel flows, compressor 20 and/or turbine 26 efficiencies, temperatures, pressures, flows, clearances, and so on, reflective of washing activities (e.g., hand cleaning). The parameters 314 may then be used to create the models 218, including risk levels based on dispersion, as described above.

Figure 4:
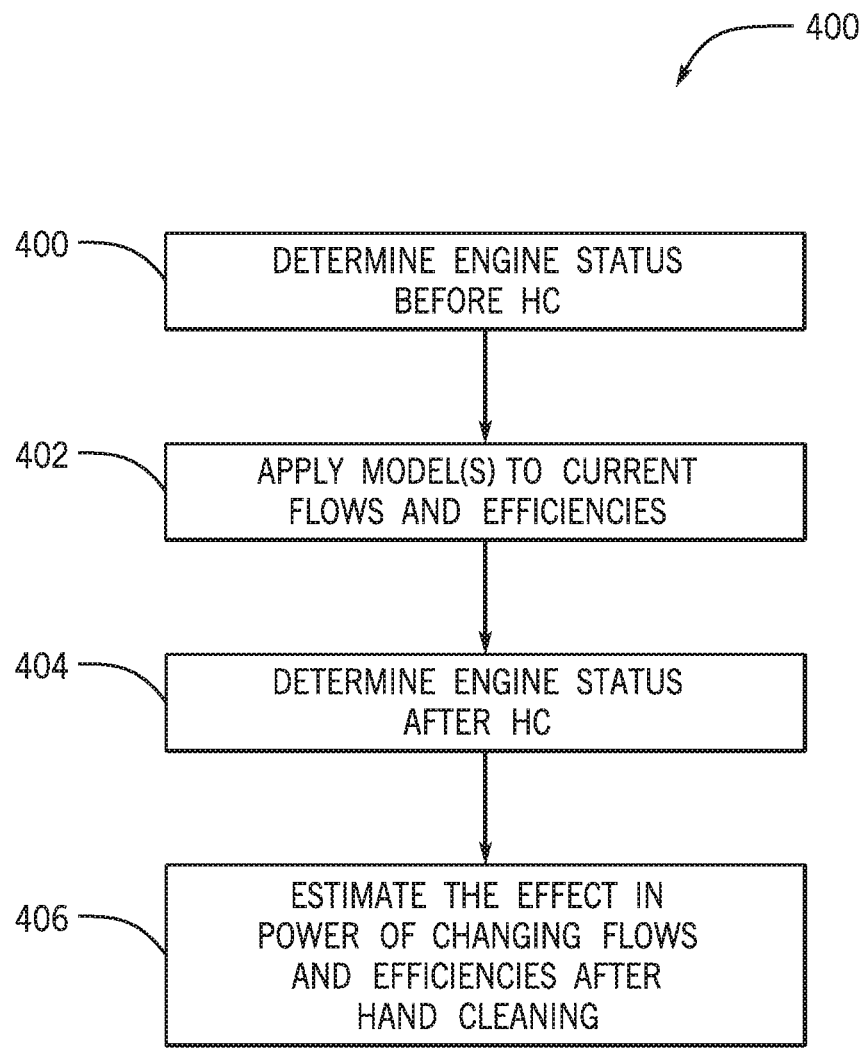
FIG. 4 is an embodiment of a process suitable for applying the forecasting and/or risk models derived via the process of FIGS. 2 and 3 to predict performance improvements for the system of FIG. 1 based on a future wash or hand cleaning.

Once the models 218 have been created the models may be used to estimate a performance gain for a specific turbine system 12 based on washing (e.g., hand cleaning) the turbine system 12. As shown in FIG. 4. More specifically, the figure illustrates an embodiment of a process 400 suitable for providing a forecast of improvements to a specific turbine engine 12 that may be achieved by restoring performance based on a wash, such as hand cleaning. The process 400 may be implemented as computer code or instructions executable by the processor(s) 39 and stored in the memories 40.

The process 400 may determine (block 402) the turbine system 12 status, e.g., in terms of compressor flows and efficacies, before hand cleaning. As mentioned previously, the model(s) 208 may be used by providing the model(s) 208 with input measurements such as temperatures, pressures, flows, fuel type, and the like, to derive (block 402) current flows and efficiencies for the specific turbine system 12 undergoing forecasting of predicted performance to be recovered. The turbine engine 12 predictive status (e.g., parameters temperatures, pressures, flows, clearances, and so on) may then be derived (block 404) after a hand cleaning. That is, a predictive status or set of parameters may be provided by using the models 218 (and/or models 208) representative of how a future hand cleaning may improve the turbine system 12. The process 400 may then estimate (block 406), effects of changes in flows and efficiencies due to the predicted parameters after hand cleaning. For example, the process 400 may execute in block 496 the models 208 (e.g., cycle deck) to the predictive stratus parameters of block 404 to derive a predictive power in megawatts, predictive flows, predictive efficiencies, and so on. Accordingly, the estimated effects may be used for further communicative and/or control actions. For example, the estimated effects may be communicated to other entities (e.g., utilities) for determination of further steps, such as directing the execution of the wash, e.g. hand cleaning. Control actions may include displaying data on operator interfaces (e.g., HMI interface 44) describing the status derived by the block 404 and estimates derived by the block 406.

Technical effects of the invention include a modeling methodology and system and a forecast methodology and system suitable for improving water wash operations, and in an exemplary embodiment, hand cleaning operations, for a turbine system. In one embodiment, water wash (e.g., hand cleaning) model(s) are derived. The model(s) capture behavior and impact of hand cleaning under different conditions of degradation for the turbine system. Because certain water wash operations such as hand cleaning may not be exactly replicable procedures, dispersion (e.g., statistical dispersion) in results may be expected and accommodated. The models may then be used to forecast expected performance improvements in the turbine system after hand cleaning, including risk levels. The forecasted performance improvements may then be used to execute maintenance actions, such as a hand cleaning.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
    sensing first operations for a first turbine system included in a fleet of turbine systems via a plurality of sensors disposed in the first turbine system before a water wash operation;
    deriving a pre-wash estimated efficiency based on sensing first operations;
    sensing second operations for the first turbine system via the plurality of sensors after the water wash operation;
    deriving a post-wash estimated efficiency based on sensing second operations;
    deriving at least one forecasting model, wherein the at least one forecasting model is based on both the pre-wash estimated efficiency and the post-wash estimated efficiency for the first turbine system, wherein the at least one forecasting model is configured to predict a performance of the first turbine system; and
    applying the at least one forecasting model to derive a predictive improvement in the performance for the first turbine system, wherein the deriving at least one forecasting model comprises deriving a wash impact efficiency based on both the pre-wash estimated efficiency and the post-wash estimated efficiency.

2. The method of claim 1, wherein the water wash operation comprises a hand cleaning, and wherein the hand cleaning comprises shutting down the first turbine system and hand scrubbing compressor components included in the first turbine system.

3. The method of claim 1, wherein the at least one forecasting model comprises a risk model configured to predict a predictive accuracy measure by deriving the wash impact efficiency based on the pre-wash estimated efficiency and the post-wash estimated efficiency.

4. The method of claim 1, comprising deriving the risk model by accounting for a statistical dispersion in data obtained via the sensing of the first and the second operations.

5. The method of claim 1, wherein deriving the at least one forecasting model comprises obtaining a baseline of turbine operations based on applying a physics-based model of the first turbine system to data obtained via the sensing of the first and the second operations.

6. The method of claim 5, wherein deriving the at least one forecasting model comprises obtaining the baseline and applying the baseline to obtain an estimate of flows and efficiencies for a gas turbine included in the first turbine system.

7. The method of claim 6, wherein the flows comprise a compressor air flow, a fuel flow, an inlet air flow, or a combination thereof, and wherein the efficiencies comprise a compressor efficiency, a turbine efficiency, or a combination thereof.

8. The method of claim 6, wherein deriving the at least one forecasting model comprises comprising tracking changes in the flows and efficiencies as a function of previous engine condition.

9. The method of claim 8, wherein deriving the at least one forecasting model comprises synthetizing the at last one forecasting model from evidence based on tracking the changes in the flows and efficiencies.

10. A system comprising:
    a memory configured to store instructions; and
    a processor configured to execute the instructions to:
        sense first operations for a first turbine system included in a fleet of turbine systems via a plurality of sensors disposed in the first turbine system before a water wash operation;
        derive a pre-wash estimated efficiency based on first data obtained during the sensing first operations;
        sense second operations for the first turbine system via the plurality of sensors after the water wash operation;
        derive a post-wash estimated efficiency based on a second data obtained during the sensing second operations;
        derive at least one forecasting model, wherein the at least one forecasting model is based on both the pre-wash estimated efficiency and the post-wash estimated efficiency for the first turbine system, wherein the at least one forecasting model is configured to predict a performance of the first turbine system; and
        apply the at least one forecasting model to derive a predictive improvement in the performance for the first turbine system, wherein the at least one forecasting model comprises a wash impact efficiency derived based on both the pre-wash estimated efficiency and the post-wash estimated efficiency.

11. The system of claim 10, wherein the water wash operation comprises a hand cleaning, and wherein the hand cleaning comprises shutting down the first turbine system and hand scrubbing compressor components included in the first turbine system.

12. The system of claim 10, wherein the processor is configured to derive the at least one forecasting model by obtaining a baseline of turbine operations based on applying a physics-based model of the first turbine system to data obtained via the sensed first and the second operations.

13. The system of claim 12, wherein the processor is configured to derive the at least one forecasting model by obtaining the baseline and applying the baseline to obtain an estimate of flows and efficiencies for the gas turbine.

14. The system of claim 12, wherein the processor is configured to derive the at least one forecasting model by tracking changes in the flows and efficiencies as a function of previous engine condition, and by synthetizing the at least one forecasting model from evidence based on tracking the changes in the flows and efficiencies.

15. The system of claim 10, comprising a controller having the processor and the memory and configured to provide the predictive improvement to an operator via an operator interface.

16. A tangible, non-transitory computer-readable media storing computer instructions thereon, the computer instructions, when executed by a processor, cause the processor to:
sense first operations for a first turbine system included in a fleet of turbine systems via a plurality of sensors disposed in the first turbine system before a water wash operation;
derive a pre-wash estimated efficiency based on first data obtained during the sensing first operations;
sense second operations for the first turbine system via the plurality of sensors after the water wash operation;
derive a post-wash estimated efficiency based on a second data obtained during the sensing second operations;
derive at least one forecasting model, wherein the at least one forecasting model is based on the pre-wash estimated efficiency and the post-wash estimated efficiency for the first turbine system, wherein the at least one forecasting model is configured to predict a performance of the first turbine system; and
apply the at least one forecasting model to derive a predictive improvement in the performance for the first turbine system, wherein the at least one forecasting model comprises a wash impact efficiency derived based on both the pre-wash estimated efficiency and the post-wash estimated efficiency.

17. The computer-readable media of claim 16, wherein the water wash operation comprises a hand cleaning, and wherein the hand cleaning comprises shutting down the first turbine system and hand scrubbing compressor components included in the first turbine system.

18. The computer-readable media of claim 16, comprising instructions that when executed by the processor cause the processor to derive the at least one forecasting model by obtaining a baseline of turbine operations based on applying a physics-based model of the first turbine system to data obtained via the sensed first and the second operations.

19. The computer-readable media of claim 18, comprising instructions that when executed by the processor cause the processor to derive the at least one forecasting model by obtaining the baseline and applying the baseline to obtain an estimate of flows and efficiencies for the gas turbine.

20. The computer-readable media of claim 19, comprising instructions that when executed by the processor cause the processor to derive the at least one forecasting model by tracking changes in the flows and efficiencies as a function of previous engine condition, and by synthetizing the at least one forecasting model from evidence based on tracking the changes in the flows and efficiencies.

* * * * *